May 26, 1970 F. M. MANION 3,513,867
TUNED AND REGENERATIVE FLUERIC AMPLIFIERS
Filed Dec. 12, 1967

Toug
137/13
X 2383
X 2384

X 2410
X 2520

INVENTOR
FRANCIS M. MANION

Harry M. Saragovitz, Edward J. Kelly, Herbert Berl & G. L. Gott.
ATTORNEYS 3,513,867
TUNED AND REGENERATIVE FLUERIC AMPLIFIERS Francis M. Manion, Rockville, Md., assignor to the United States of America as represented by the Secretary of the Army Filed Dec. 12, 1967, Ser. No. 690,030
Int. Cl. F15c 1/06
U.S. Cl. 137—81.5 5 Claims

ABSTRACT OF THE DISCLOSURE

A flueric amplifier using controllable intrinsic inductance and capacitance effects at the vent for tuning a vent "tank circuit" to tune the amplifier. Transport phase lag of the fluid jet is used to provide regenerative feedback for a regenerative amplifier.

BACKGROUND OF THE INVENTION

This invention relates to flueric amplifiers and, more particularly, tomean s for tuning such amplifiers and for applying regenerative feedback.

Attempts have previously been made to tune flueric amplifiers by tuning output lines. Feedback has been used from the output passages.

The present invention tunes the amplifier by using a controllable intrinsic "tank circuit" within the amplifier. Tank circuits have previously been used with electronic amplifiers, but no way has been known to identify or control the tank circuit of a flueric amplifier.

SUMMARY OF THE INVENTION

In a flueric amplifier, the impedance effect of the vent on the flow of fluid through the vent creates a pressure field which backs up from the vent to the jet of fluid flowing from supply to receivers. This pressure field affects the direction of jet flow. For a reasonably large vent opening, the D.C. resistance to vent fluid flow is negligibly small. But the amplifier dimensions can be designed to create substantial inductance and capacitance effects in the vent "circuit." These effects cause the equivalent of a tank circuit at the vent. The tank circuit causes a dynamic resonant pressure field which acts to tune the flueric amplifier to a frequency determined by the inductance and capacitance.

Jet transport phase shift is caused by the time delay in transporting an element of jet fluid mass from supply to receiver. Transport phase shift, added to tank phase shift, can be used to cause regenerative feedback.

It is an object of this invention to use a vent tank circuit in a flueric amplifier to tune the amplifier.

It is a further object of this invention to use a tank circuit in connection with jet transport phase shift for regenerative feedback in a flueric amplifier.

DESCRIPTION OF THE PREFERRED EMBODIMENTS

Figures 1, 2:
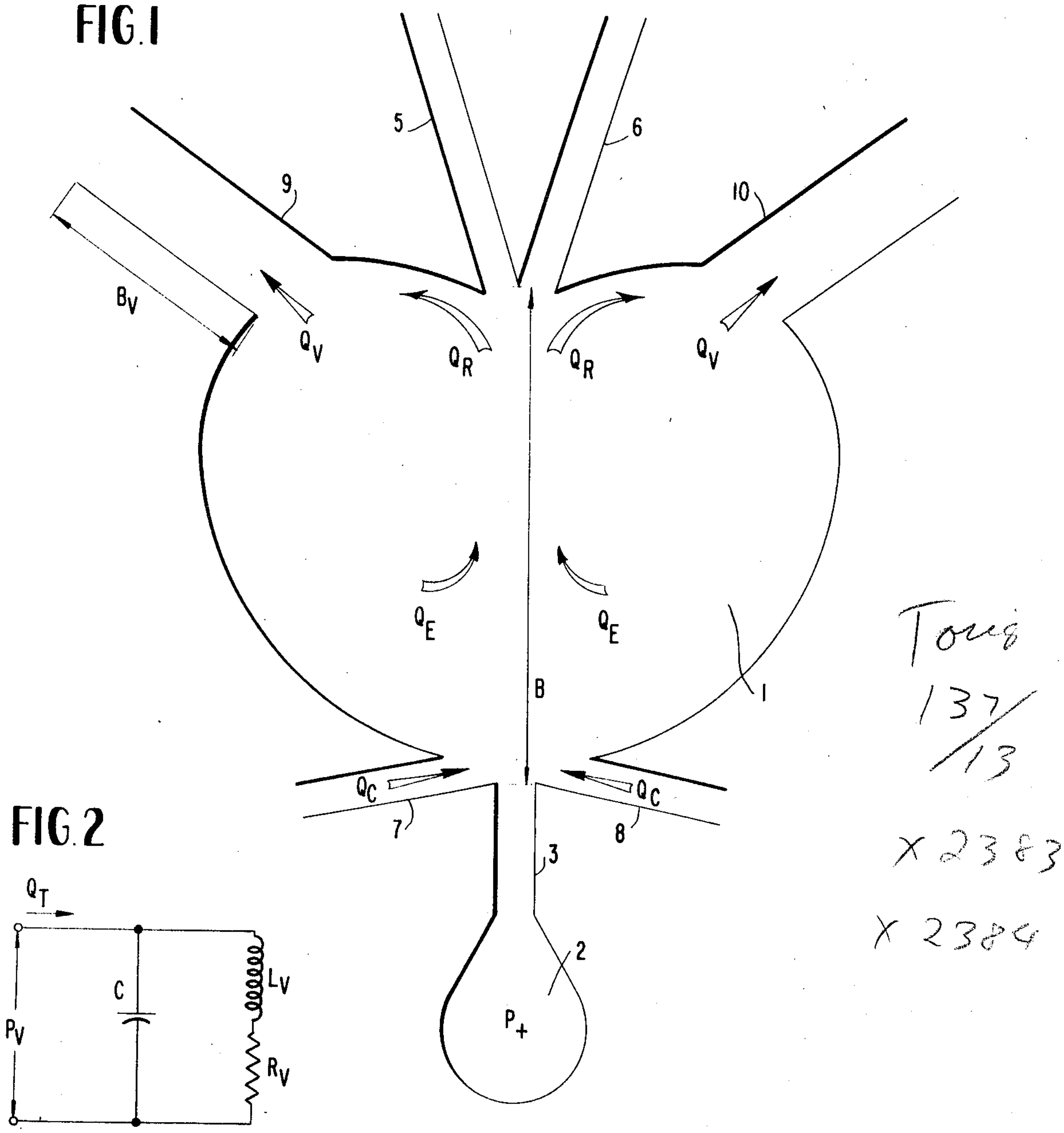
FIG. 1 is a cross-sectional diagram of a flueric amplifier as used in the present invention
FIG. 2 is a schematic diagram showing the electrical equivalent of the vent tank circuit of the present invention.

FIG. 1 shows a flueric amplifier of the type used in this invention. Fluid, which may be liquid or gas, is supplied to a chamber 1 from a source 2 of constant pressure $P_+$ through a nozzle 3. The jet is directed such that, when undeflected, it is split equally by the dividing section 4 and enters receivers 5 and 6. Control fluid currents $Q_C$ enter chamber 1 through control channels 7 and 8, deflecting the jet by pressure and momentum effects. This deflection causes the jet to be off center at the receiver inlets, thus amplifying control channel input pressures at receiver outlets.

Vents 9 and 10 connect chamber 1 to atmospheric pressure. Each vent has a cross-sectional area A and an outlet chamber length $B_V$.

Assume that the jet from supply $P_+$ through supply nozzle 3, when applied with no control pressures, is symmetrical and therefore is split by the dividing section 4 between receivers 5 and 6. Then any deflection of the jet from this symmetrical center position, as caused by deflection forces, can be called $\Delta y$. The deflection forces causing $\Delta y$ are the pressure field effect, caused by difference in pressure in the two sides of the chamber, and momentum interaction, caused by momentum interchange between the mass of the control stream and the mass of the supply jet. The effect of the pressure difference is given by $A_V(\Delta P_V)$ where $\Delta P_V$ is the effective pressure difference between the two sides of the chamber and $A_V$ is a scale factor based upon the effect of such $\Delta P_V$ in the particular amplifier configuration.

The effect of the momentum interaction is given by $A_C(\Delta P_C - \Delta P_V)$ where $\Delta P_C$ is the difference in the supply pressures of the two control channels and $A_C$ is a scale factor based on the effect of such momentum-causing pressure difference $(\Delta P_C - \Delta P_V)$ in the particular amplifier configuration.

Thus the normalized lateral deflection $$\Delta y = A_C(\Delta P_C - \Delta P_V) + A_V(\Delta P_V) \quad (1)$$

This assumes that the return momentum flux from the outer edge of the jet has been suppressed or is negligible.

The storage of fluid under pressure in the chamber provides an effect analogous to capacitance C in an electric circuit, where pressure is analogous to voltage and fluid flow is analogous to current. However, in this system the change in the amount of fluid stored is only slightly affected by compression due to increased pressure, as would be analogous to increased storage of charge on a capacitor due to increased voltage. Rather, the major increased fluid storage is due to shifting of the boundaries of the jets dividing the two halves of the chamber, which would be analogous to changing the size of a capacitor due to increased voltage. However, the effect, for the purpose of this circuit, is the same as if the "capacitance" were fixed and the change in fluid stored were due to compression from increased pressure.

The size of the total capacitance C is given by the ratio of change in fluid mass stored divided by change in pressure. Considering the total capacitance of the chamber, $$C = \frac{B^3 d}{6(P_+)w} \quad (2)$$

where

B is the distance from the supply nozzle to the receiver inlets, $d$ is the depth of the chamber (measurede perpendicular to FIG. 1), $P_+$ is supply pressure, and $w$ is the width of the supply nozzle.

Capacitance would be half this value if considered for one side only of the chamber.

There is also an effect analogous to inductance $L_V$ in the circuit due to the time delay required to accelerate fluid mass leaving the chamber through the vents. This inductance is proportional to the length $B_V$ of the vent outlet channel from the chamber to atmospheric pressure, proportional to the mass $\rho$ of the fluid to be accelerated, and inversely proportional to the cross-sectional area A of the vent. Thus:

$$L_V=\rho\frac{B_V}{A}\tag{3}$$

There is also a vent resistance effect $R_V$ analogous to resistance. This is the substantially linear retarding effect of the vent on the flow of direct fluid current. Because the cross-sectional area of the vent is large, $R_V$ is small.

Taken together, C, $R_V$ and $L_V$ have an effect analogous to an electrical tank circuit at the vent, as shown in FIG. 2.

The total fluid entering a chamber is $Q_C$ from the control channel plus $Q_R$, the returned fluid. $Q_R$ is that portion of the jet which does not enter the receivers. The total fluid leaving a chamber is $Q_V$ entering the vent circuit plus $Q_E$, the entrained fluid caught up and swept along by the edge of the jet. The difference between fluid entering and leaving the chamber is fluid $Q_T$ stored or released from the capacitor. Thus, $Q_C+Q_R-Q_V-Q_E=Q_T$, where $$Q_T=\frac{CdP_V}{dt}$$

Thus, $$Q_C+Q_R-Q_V-Q_F=\frac{CdP_V}{dt}\tag{4}$$

By analogy with electrical tank circuits:

$$L_V\frac{dQ_V}{dt}+R_VQ_V=P_V\tag{5}$$

By applying Laplace transforms, ignoring initial conditions, Equation 4 becomes:

$$\overline{Q}_C+\overline{Q}_R-\overline{Q}_V-\overline{Q}_E=Cs\overline{P}_V\tag{6}$$

and Equation 5 becomes $$L_Vs\overline{Q}_V+R_V\overline{Q}_V=\overline{P}_V$$

$$\overline{Q}_V=\frac{\overline{P}_V}{L_Vs+R_V}\tag{7}$$

Combining Equations 6 and 7 gives $$\overline{Q}_C+\overline{Q}_R-\frac{\overline{P}_V}{L_Vs+R_V}-\overline{Q}_E=Cs\overline{P}_V\tag{8}$$

Rearrangement gives $$\overline{Q}_C+\overline{Q}_R-\overline{Q}_E=\left[\frac{C(L_Vs+R_V)+1}{L_Vs+R_V}\right]\overline{P}_V\tag{9}$$

and $$\overline{P}_V=(\overline{Q}_C+\overline{Q}_R-\overline{Q}_E)\left[\frac{L_Vs+R_V}{L_VCs^2+R_VCs+1}\right]\tag{10}$$

If $Q_C$ is taken as $K(P_C-P_V)$, or in Laplace notation $\overline{Q}_C=K(\overline{P}_C-\overline{P}_V)$ Equation 10 becomes $$\overline{P}_V=(K\overline{P}_C-K\overline{P}_V+\overline{Q}_R-\overline{Q}_E)\left[\frac{L_Vs+R_V}{L_VCs^2+R_VCs+1}\right]\tag{11}$$

which simplifies to $$\overline{P}_V=(K\overline{P}_C-\overline{Q}_E+\overline{Q}_R)\left[\frac{L_Vs+R_V}{LCs^2+(R_VC+KL)s+R_VK+1}\right]\tag{12}$$

For deflections up to half a nozzle width, which is nearly to the input saturation point, return flow $Q_R$ from the receivers is approximately linear with change of $\Delta y$. Thus the assumption is made that $$\Delta Q_R=\Delta y\cdot\frac{\Delta Q_R}{\Delta y}$$

where $\Delta Q_R/\Delta y$ is a constant. In Laplace notation this is written as $$\Delta\overline{Q}_R=\Delta\overline{y}\cdot\left|\frac{\Delta Q_R}{\Delta y}\right|_k\tag{13}$$

Define $$\frac{L_Vs+R_V}{L_VCs^2+(R_VC+KL_V)s+R_VK+1}=\frac{N_{(s)}}{D_{(s)}}\tag{14}$$

Thus Equation 12 becomes $$\overline{P}_V=(K\overline{P}_C-\overline{Q}_E+\overline{Q}_R)\left[\frac{N_{(s)}}{D_{(s)}}\right]\tag{15}$$

or $$\Delta\overline{P}_V=(K\Delta\overline{P}_C-\Delta\overline{Q}_E+\Delta\overline{Q}_R)\left[\frac{N_{(s)}}{D_{(s)}}\right]\tag{16}$$

The Equation 1 can be Laplace transformed to $$\Delta\overline{y}=A_C(\Delta\overline{P}_C-\Delta\overline{P}_V)+A_V(\Delta\overline{P}_V)\tag{17}$$

Combining Equations 16 and 17 gives $$\Delta\overline{y}=A_C\Delta\overline{P}_C+(A_V-A_C)(K\Delta\overline{P}_C-\Delta\overline{Q}_E+\Delta Q_R)\left[\frac{N_{(s)}}{D_{(s)}}\right]\tag{18}$$

Combining Equations 13 and 18 gives $$\Delta\overline{y}=A_C\Delta\overline{P}_C=(A_V-A_C)\left(K\Delta\overline{P}_C-\Delta\overline{Q}_E+\Delta\overline{y}\left|\frac{\Delta Q_R}{\Delta y}\right|_k\right)\left[\frac{N_{(s)}}{D_{(s)}}\right]\tag{19}$$

If the assumption is made in Equation 19 that $\Delta Q_E=0$, that is, there is no change in the entrained flow on either side as the jet is shifted, Equation 19 simplifies to:

$$\Delta\overline{y}=A_C\Delta\overline{P}_C+(A_V-A_C)\left(K\Delta\overline{P}_C+\Delta\overline{y}\left|\frac{\Delta Q_R}{\Delta y}\right|_k\right)\left[\frac{N_{(s)}}{D_{(s)}}\right]\tag{20}$$

Then $$\frac{\Delta\overline{y}}{\Delta\overline{P}_C}=\frac{A_C+K(A_V-A_C)\left[\frac{N_{(s)}}{D_{(s)}}\right]}{1-(A_V-A_C)\left|\frac{\Delta Q_R}{\Delta y}\right|_k\left[\frac{N_{(s)}}{D_{(s)}}\right]}$$

or $$\frac{\Delta\overline{y}}{\Delta\overline{P}_C}=\frac{A_C\left[1-\frac{KN_{(s)}}{D_{(s)}}\right]+A_V\frac{KN_{(s)}}{D_{(s)}}}{1-(A_V-A_C)\left|\frac{\Delta Q_R}{\Delta y}\right|_k\left[\frac{N_{(s)}}{D_{(s)}}\right]}\tag{21}$$

Figure 3:
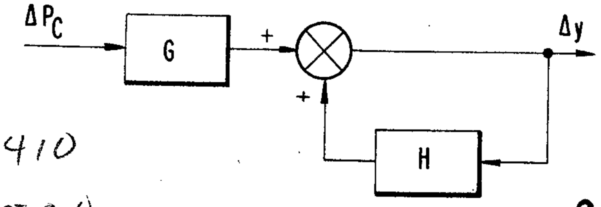
FIG. 3 is a block diagram of an equivalent circuit showing the forward gain and feedback of the present invention.

Equation 21 is in the form of a solution of the block diagram of FIG. 3, where $$G=A_C\left[1-\frac{KN_{(s)}}{D_{(s)}}\right]+A_V\frac{KN_{(s)}}{D_{(s)}}\tag{22}$$

and $$H=(A_V-A_C)\left|\frac{\Delta Q_R}{\Delta y}\right|_k\left[\frac{N_{(s)}}{D_{(s)}}\right]\tag{23}$$

The value of $$\left|\frac{\Delta Q_R}{\Delta y}\right|_k$$

is inherently negative. The feedback H, shown in FIG. 3 as positive at the summing point, is actually negative. H is inherently negative because $$\left|\frac{\Delta Q_R}{\Delta y}\right|_k$$

is negative. As an example of this negative feedback, if a control stream from channel 8 of FIG. 1 pushes the jet to the left side of the chamber, a certain amount of fluid will be shunted to the left side at the receivers, and will cause some additional pressure on the right side, tending to force the jet back to the center. This tendency to preserve the status quo is indicative of negative feedback.

However, other factors must be considered when using the circuit for alternating pressures.

TUNED AMPLIFIER

For a tuned amplifier, the configuration may be such that $$\left|\frac{\Delta Q_R}{\Delta y}\right|_k$$

tends toward zero. This makes H tend toward zero, and the system approaches G.

$$\left|\frac{\Delta Q_R}{\Delta y}\right|_k$$

becomes very small if the input to the receiver is enlarged so that substantially all of the jet enters one or the other of the receivers. This makes $Q_R$ very small, and any change $\Delta Q_R$ must be small compared to $\Delta y$.

The resonant frequency of a tank described by Equation 5 is given by $$\omega_m=\sqrt{\frac{1}{L_V C}} \qquad (24)$$

Referring to Equation 14, when the vent resistance $R_V$ is small:

$$\frac{KN_{(s)}}{D_{(s)}}=\frac{KL_V s}{L_V C s^2+KL_V s+1} \qquad (25)$$

At $\omega_m$, $$\frac{KN_{(s)}}{D_{(s)}}=1$$

and at any other frequency $\omega_m<1$, approaching zero at extremes. Thus, in Equation 22, G at $\omega_m$ equals $A_V$, and G at extremes approaches $A_C$.

Taking, as typical values, $A_V=25$ and $A_C=10$, this causes the flueric amplifier to be a bandpass amplifier centered about $\omega_m$. The gain $\Delta y/\Delta P_C$ then equals 25 at $\omega_m$ and 10 at the extremes.

A flueric amplifier can be designed to be tuned to $\omega_m$ if designed as follows:

(1) The receiver inlets are made large enough so that one or the other inlet or the combination will capture substantially the entire jet, allowing substantially no return flow.

(2) The vent opening is made large enough to offer very low resistance to the flow of fluid under direct pressure.

(3) The distance B, depth $d$, supply pressure $P_+$ and nozzle width $w$, the parameters of C where $$C=\frac{B^2 d}{6(P_+)w}$$

and the fluid mass $\rho$, distance $B_V$ and cross-sectional area A, the parameters of $L_V$ where $$L_V=\rho\frac{B_V}{A}$$

are set such that $$\omega_m=\sqrt{\frac{1}{L_V C}}$$

REGENERATIVE AMPLIFIERS

The previously discussed tuned amplifier operated without any feedback H. A regenerative amplifier requires positive feedback to increase the amplification factor. Thus $$\left|\frac{\Delta Q_R}{\Delta y}\right|$$

which was made zero for the tuned amplifier without feedback, is not zero for the regenerative amplifier.

The transport phase angle $\Phi_t$ must be considered in determining the regenerative phase conditions. $\Phi_t$ is the jet phase angular movement from the center line at the receiver caused by the variation in force on a fluid particle during the time required to travel from the supply output nozzle to the receiver input. If the average jet velocity is $V_+$, the time required to travel distance B is $B/V_+$ and the phase shift during transport is $$\frac{B}{V_+}\omega_m$$

A total phase shift of 180° is required for a regenerative amplifier. At $\omega_m$, 90° of this shift will come from the phase shift in the vent tank circuit. The other 90° must come from the transport phase angle. For regeneration, the tank circuit need not be tuned exactly to the input frequency, as there is some regeneration of frequencies to each side of $\omega_m$. However, maximum regeneration occurs for $\omega_m$ input with 180° shift.

Because $$\frac{N_{(s)}}{D_{(s)}}=1$$

for $\omega_m$, H becomes equal to $$(A_V-A_C)\left|\frac{\Delta Q_R}{\Delta y}\right|_k$$

This term, in the form $$\frac{1}{1-H}$$

would also give an indication of the transport phase shift.

If $GH\geq 1$, oscillation will result. This is because the closed-loop gain becomes greater than 1 at 180° and the Nyquist point becomes encircled. Care must be taken to insure that $A_V$ at $\omega_m$ is not less than $A_C$. If $A_V<A_C$, the sign of the feedback changes, and no regeneration can exist.

A regenerative flueric amplifier is designed in the following steps:

(1) The receiver inlets are made small enough so that some return flow takes place, making $$\left|\frac{\Delta Q_R}{\Delta y}\right|_k<0$$

(2) The vent opening is made large enough to offer very low resistance to the flow of fluid under direct pressure.

(3) The frequency $f_m$ of the regenerative frequency is determined to find $\omega_m=2\pi f_m$.

(4) The transport phase shift $\Phi_t$ is set to a predetermined phase angle of 90°. The greater the angle is, the greater the degree of regeneration. This is done by controlling a size parameter of the amplifier, preferably length B. Changes in supply pressure will affect jet velocity $V_+$ in a manner well known to one skilled in the art. However, changes in supply pressure cause changes in the tank circuit resonant frequency. If B is varied, $$B=\frac{\Phi_t V_+}{\omega_m}$$

(5) The parameters of the tank circuits are then varied to cause resonance at $\omega_m$. Any parameter except supply pressure $P_+$ can be varied, but length $B_V$ of the vent outlet channel is the preferred parameter. Variation of $B_V$ varies tank inductance $L_V$. Changes of pressure $P_+$ have only second order effects, because they also change jet velocity $V_+$.

The total phase shift is then the desired phase shift for regenerative feedback.

Several interesting side effects can be observed from these equations, which are not part of the preferred embodiment.

From Equation 19, it can be seen that changes in entrainment flow $\Delta Q_E$ can also change the amplification. By changing the entrainment flow by means such as sound pressure waves, the output can be varied to modulate the output signal.

From Equation 21, it can be seen that if $A_C=A_V$, the vent tank circuit will have no effect and the total gain will be equal to $A_C$. This will eliminate ringing and oscillation in a flueric amplifier.

Throughout the specification, where measurements are given, the units are preferably in the English system of units, although m.k.s. and c.g.s. systems can also be used. Thus, pressure is given in p.s.i., flow in cu. in./sec., resistance in p.s.i./cu. in./sec., and lengths in inches.

Note that in the system with regenerative feedback, tuning cannot be easily accomplished by changes of supply pressures. $V_+$, which is also controlled by pressure, tends to cancel changes in $P_+$, leaving only second order effects to change the tuning.

THIRD ORDER EQUATIONS

In going from Equation 10 to Equation 11, the assumption was made that the control channel has only resistive impedance, thus making $Q_C=K(P_C-P_V)$. If the control input is assumed to have inductance $L_C$ as well as resistance $R_C$, then K is not a complete statement of the input impedance. It is more accurate to say $$Q_C=\frac{K_o}{L_Cs+R_C}(P_C-P_V) \qquad (26)$$

The more accurate equivalent of Equation 12 becomes $$\overline{P}_V=\frac{(K\overline{P}_C-\overline{Q}_E+\overline{Q}_R)(L_Vs+R_V)(L_Cs+R_C)}{L_VL_CCs^3+(L_VR_C+L_CR_V)Cs^2+(L_V+L_C+R_VR_CC)s+R_V+R_C} \qquad (27)$$

In the ordinary or typical design case, the use of Equation 27 in place of Equation 12 causes only a 0.3% change in the final values. The slight increase in accuracy will not ordinarily justify the use of the third order Equation 27 in place of second order Equation 12. The term $L_Cs+R_C$ can be factored out of the denominator of Equation 27 and in typical cases is so far removed from the tank resonant frequency that is can be ignored.

I claim:

1. In a flueric amplifier having a pressured fluid source forcing a fluid jet through a supply nozzle into a chamber, receiver means for receiving at least some fluid from said fluid jet, control channel means for carrying control fluid into said chamber to deflect said fluid jet, and vent means for allowing excess fluid to leave said chamber, the improvement comprising:

(A) vent means having vent openings large enough to cause very low resistance to the flow through said vent openings of fluid under direct pressure, and (B) vent tank circuit means tuned to a predetermined angular frequency $\omega_m$, where $$\omega_m=\sqrt{\frac{1}{L_VC}},\ L_V=\frac{\rho B_V}{A},\ \text{and } C=\frac{B^2d}{6(P_+)w}$$

in which $P_+$ is the supply pressure, $w$ is supply nozzle width, $d$ is the depth of the amplifier chamber measured perpendicular to the plane of fluid flow, B is the distance from the supply jet outlet to the receiver inlet, $\rho$ is the fluid mass, $B_V$ is the length of the vent outlet channel, and A is the cross-sectional area of the vent means.

2. A flueric amplifier according to claim 1 wherein said receiver means has receiver inlet means which are large enough to receive substantially the entire fluid jet, allowing no return flow.

3. A flueric amplifier according to claim 1 wherein:

(A) said reeciver means has receiver inlet means which are small enough so that some return flow takes place, and (B) the transport phase angle $\Phi_t$ is set to a predetermined phase angle of 90°, wherein $$\Phi_t=\frac{B\omega_m}{V_+}$$

and $V_+$ is the average velocity of said fluid jet.

4. A method of tuning a flueric amplifier having a fluid source to be pressurized to a pressure $P_+$ and to force a fluid jet of velocity $V_+$ through a supply nozzle into a chamber, receiver means for receiving at least some fluid from said fluid jet, control channel means for carrying control fluid into said chamber to deflect said fluid jet, and two vents each having a cross-sectional area A and a vent outlet channel of length $B_V$ for allowing excess fluid to leave said chamber comprising:

(A) making said cross-sectional area A large enough to cause very low resistance to the flow through said vents of fluid under direct pressure, (B) choosing the angular frequency $\omega_m$ at which the circuit should resonate according to the equation $$\omega_m=\sqrt{\frac{6(P_+)wA}{B^2d\rho B_V}}$$

where:

$w$ is supply nozzle width,

B is the distance from the supply jet outlet to the receiver inlet, $d$ is the depth of the amplifier chamber measured perpendicular to the plane of fluid flow, and $\rho$ is the fluid mass, determining which of the physical parameters of the system occurring in the equation are to be varied to tune the system to $\omega_m$, (C) determining the values of any of said physical parameters to be kept constant, and (D) varying the said physical parameters to be varied to cause $\omega_m$ in the equation and the system to equal the chosen angular frequency at which the circuit should resonate.

5. A method of applying regenerative feedback to a system tuned according to claim 4 further comprising:

(A) making the inlet means of said receiver means small enough to allow some return flow to take place, and (B) varying the physical parameters of said system in conjunction with step D to set the phase angle $\Phi_t$ to 90°, where $$\Phi_t=\frac{B\omega_m}{V_+}$$

References Cited

UNITED STATES PATENTS

| | | | |
|---|---|---|---|
| 3,217,727 | 11/1965 | Spyropoulos | 137—81.5 |
| 3,275,013 | 9/1966 | Colston | 137—81.5 |
| 3,294,103 | 12/1966 | Bowles | 137—81.5 |
| 3,379,204 | 4/1968 | Kelley et al. | 137—81.5 |
| 3,398,758 | 8/1968 | Unfried | 137—81.5 |
| 3,402,727 | 9/1968 | Boothe | 137—81.5 |
| 3,413,994 | 12/1968 | Sowers | 137—81.5 |
| 3,413,996 | 12/1968 | Fine | 137—81.5 |

SAMUEL SCOTT, Primary Examiner